United States Patent [19]

Basavanhally

[11] Patent Number: 5,065,933
[45] Date of Patent: Nov. 19, 1991

[54] ELECTRONIC DEVICE MANIPULATING APPARATUS AND METHOD

[75] Inventor: Nagesh R. Basavanhally, Trenton, N.J.

[73] Assignee: AT&T Bell Laboratories, Murray Hill, N.J.

[21] Appl. No.: 584,831

[22] Filed: Sep. 19, 1990

[51] Int. Cl.[5] .............................................. B23K 1/018
[52] U.S. Cl. .................................. 228/102; 228/191; 228/264; 228/9
[58] Field of Search ............... 228/102, 119, 131, 264, 228/180.2, 6.2, 9, 44.7; 29/741, 762

[56] References Cited

U.S. PATENT DOCUMENTS

| | | | |
|---|---|---|---|
| 4,295,596 | 10/1981 | Doten et al. | 228/180.2 |
| 4,561,586 | 12/1985 | Abel et al. | 228/119 |
| 4,577,513 | 3/1986 | Harwood et al. | 73/862.04 |
| 4,611,296 | 9/1986 | Nidermayr | 364/513 |
| 4,854,494 | 8/1989 | von Raben | |
| 4,923,521 | 5/1990 | Lui et al. | 134/5 |

OTHER PUBLICATIONS

"Flip-Chip Replacement within the Constraints Imposed by Multilyaer Ceramic (MLC) Modules", K. J. Puttlitz, *Journal of Electronic Materials*, vol. 13, No. 1, 1984, pp. 29–47.

Primary Examiner—3
Assistant Examiner—Samuel M. Heinrich
Attorney, Agent, or Firm—Roderick B. Anderson

[57] ABSTRACT

A robotically controlled pick-uo to tool (11) is modified by connecting to it a load cell (26) that generates a signal indicative of stress on the pick-up tool. The pick-up tool is directed toward a chip (12) to be removed and movement is stopped when the load cell generates a first signal indicative of a first level of stress. In addition to stopping movement of the pick-up tool, the first signal actuates heating of the tool to a temperature sufficient to melt the solder (13) bonding the chip to the substrate (14). The melting of the solder bonds (13) results in a reduction of stress on the tool, which causes the load cell (26) to generate a signal indicative of the second level of stress. The second signal actuates the vacuum of the pick-up tool to cause adhesion of the chip to the pick-up tool and also initiates movement of the pick-up tool so as remove the chip from the substrate.

14 Claims, 3 Drawing Sheets

ELECTRONIC DEVICE MANIPULATING APPARATUS AND METHOD

TECHNICAL FIELD

This invention relates to processes for fabricating electronic devices, and, more particulary, to methods for using robots to remove soldered elements from a substrate.

BACKGROUND OF THE INVENTION

Electronic circuit systems are typically made by defining complex integrated circuit structures in semiconductor chips, bonding the chips to circuit package subsrtates, and in turn bonding the packages to printed circuit boards. For interconnection and structural bonding, increased use is being made of "flip chip" technology, in which an integrated circuit chip is soldered directly to the surface of a substrate with the conductor pattern of the chip facing the substrate. In accordance with known "surface mounting" techniques, a plurality of solder "bumps" are formed on either or both the chip and the substrate, and the bonding is made by heating the structure to melt (or reflow) the solder so that, when the solder hardens, the chip is bonded to the substrate. The bonded portions electrically interconnect circuits on the chip and the substrate as well as structurally bonding them.

When the device package comprises a ceramic substrate upon which a circuit has been defined that makes connection with several chips mounted on it, the result is usually referred to as a hydrid integrated circuit (HIC). To accommodate the higher circuit density of modern chips, there has arisen a demand for more complex circuitry on the substrate that can conveniently be made on a ceramic substrate. To meet these demands, workers have developed silicon substrates upon which denser circuit patterns of two or more levels can be formed; such packages are still generally in the developmental stage and are sometimes known as advanced VLSI packaging (AVP).

An AVP package may typically comprise many chips each connected by a multiplicity of solder bonds to a substrate to form with the substrate a complex system or subsystem. Because of the complexity of the chips and of the circuit as a whole, after the circuit package has been assembled, it is frequently found that one of the chips must be removed for repair or replacement. This can be done by either shearing or melting the solder bonds, removing the chip, and then rebonding a replacement or repaired chip using the surface mount techniques described previously. It is obvious that shearing the solder bonds would be a difficult and tedious task which would be likely to damage the substrate. Melting all of the solder bonds on the substrate might be harmful to interconnections to chips that are not to be removed. It has therefore been clear for some time that there is a need for apparatus and methods for expediting the selective removal of integrated circuit devices which are solder bonded at a multiplicity of points to a substrate. It is important that such removal be made in such a manner that one does not cause spurious short circuits betwen adjacent bonding pads of the substrate and such that remnant solder can be expediently removed after chip removal.

SUMMARY OF THE INVENTION

In accordance with one embodiment of the invention, a robotically controlled vacuum pick-up tool is modified by connecting to it a load cell that generates a signal indicative of stress on the pick-up tool. The pick-up tool is directed toward the chip to be removed and movement is stopped when the load cell generates a first signal indicative of a first level of stress. In addition to stopping movement of the pick-up tool, the first signal actuates heating of the tool to a temperature sufficient to melt the solder bonding the chip to the substrate. The melting of the solder bonds results in a reduction of stress on the tool which causes the load cell to generate a second signal indicative of the second level of stress. The second signal actuates the vacuum of the pick-up tool to cause adhesion of the chip to the pick-up tool. The second signal also initiates movement of the pick-up tool so as to remove the chip from the substrate.

It can be appreciated that the sequence of operations can be readily implemented by automatic apparatus so as to remove a desired chip from a substrate. Melting of the solder can be made to be highly localized and highly controlled so as to prevent molten solder from accidentally short circuiting adjacent bonding pads on either the chip or the substrate. The remnant solder is controlled for convenient removal after removal of the chip, and there is no significant effect by the process on neighboring chips. These and other objects, benefits and advantages of the invention will be better understood from a consideration of the following detailed description taken in conjunction with the accompanying drawing.

DETAILED DESCRIPTION

Figure 1:
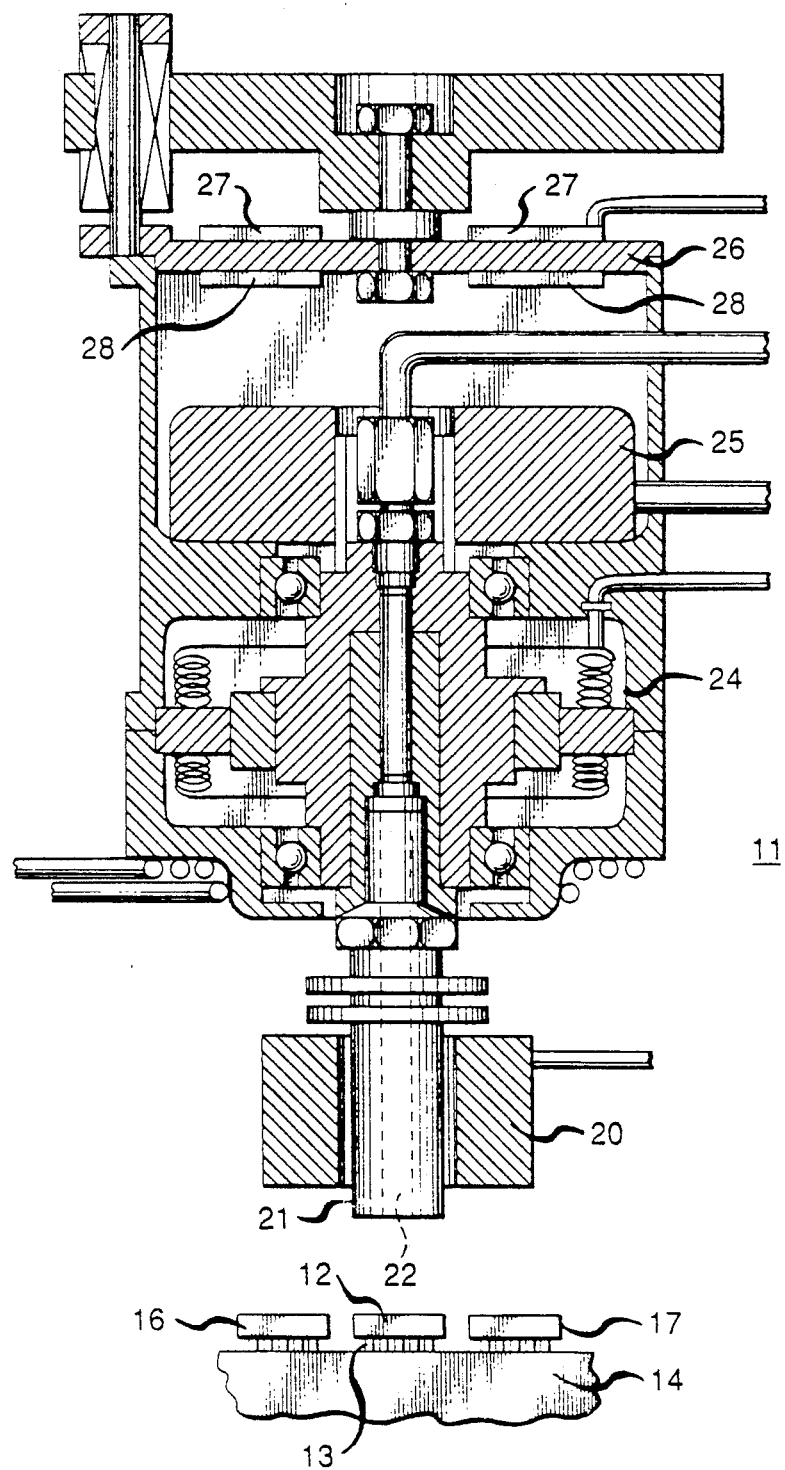
FIG. 1 is a sectional view of a robotically controlled vacuum pick-up tool which has been modified in accordance with an illustrative embodiment of the invention.

It is to be understood that, where appropriate, dimensions of certain structures shown in the drawings have been distorted for the purpose of improving clarity and for promoting understanding of the invention.

Referring to FIG. 1, there is shown schematically and partially in section a robotically controlled vacuum pick-up tool 11 that has been structurally modified in accordance with an illustrative embodiment of the invention. The purpose of the tool is to contact an integrated circuit chip 12 bonded by solder bonds 13 to a substrate 14, melt the solder bonds, and remove the chip from the substrate. Substrate 14 and integrated circuit chip 12, along with adjacent integrated circuit chips 16 and 17, may constitute part of an AVP module. That is, a complex circuit on the surface of substrate 14 is interconnected by the multiplicity of solder bonds 13 to a complex circuit on the surface of integrated circuit chip 12 that faces the substrate. The solder bonds also provide structural support for the integrated circuit chip on the AVP module.

A heater element 20 surrounds a contact member 21 of the pick-up tool. It is intended that after the pick-up tool makes contact with chip 12, heater 20 heats the chip sufficiently to melt the solder bonds so as to permit removal by vacuum pick up. A vacuum is selectively applied to a vacuum channel 22 to permit chip pick-up and subsequent removal from the module.

Figure 2:
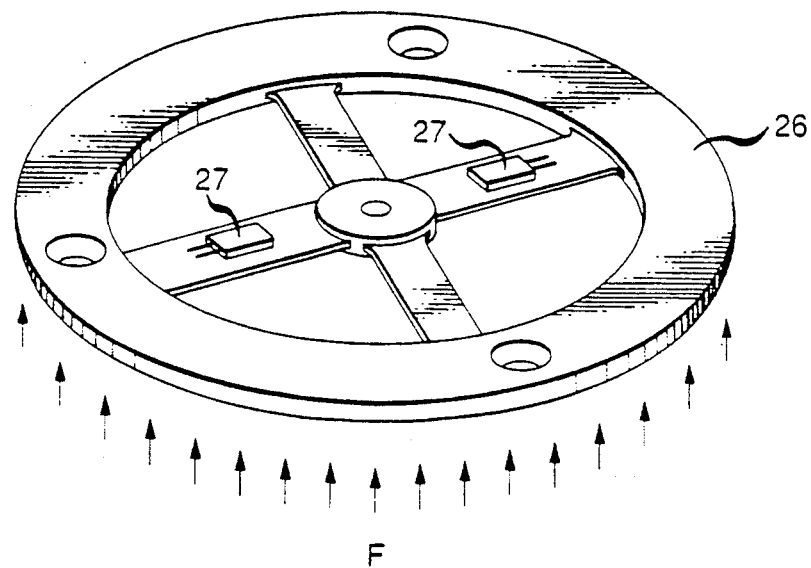
FIG. 2 is a perspective view of a load cell used in the apparatus of FIG. 1.

Rotational movement of the tool is selectively provided by an electrical motor 24 which may be a motor known as Model No. RBE01500, commercially available from the Inland Motor Company of Sierra Vista, AZ. A modular encoder 25 monitors movement of the pick-up tool and may be Model R80, commercially available from the Renco Company of Goleta, CA. In accordance with the invention, a load cell 26 is rigidly coupled to the contact element 21 so as to generate electrical signals indicative of stress on the contact element 21. Referring to FIG. 2, the load cell 26 comprises two strain gauge portions 27 that respond to compression and two portions 28 that respond to tension. These are connected as two of four arms of a resistance bridge in a know manner so as to generate an output signal indicative of the force F transmitted to the load cell 26.

Figure 3:
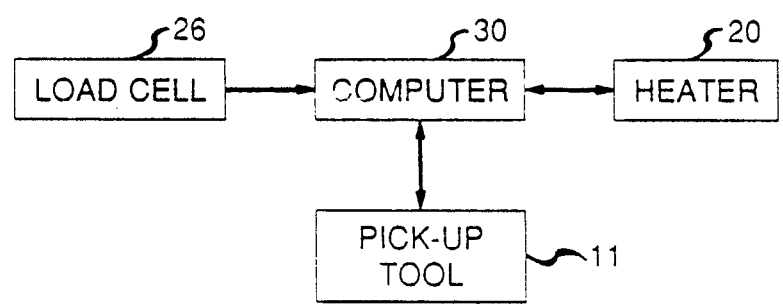
FIG. 3 is a block diagram showing operation of the pick-up tool of FIG. 1.

The vacuum pick-up tool 11 of FIG. 1 is illustrative mounted in a Seiko robot, commercially available from Seiko Instruments USA, Torrance, CA. The movement in three dimensions of the pick-up tool 11 is controlled in a known manner so as to permit contact element 21 to contact a selected one of the integrated circuit chips such as chip 12. Referring to FIG. 3, the robot is controlled by a computer 30 which thereby controls pick-up tool 11. Electrical signals from the load cell 26 are transmitted to the computer and constitute an input. The computer also controls the heat generated by heater 20 and receives temperature data from the heater.

Figure 5:
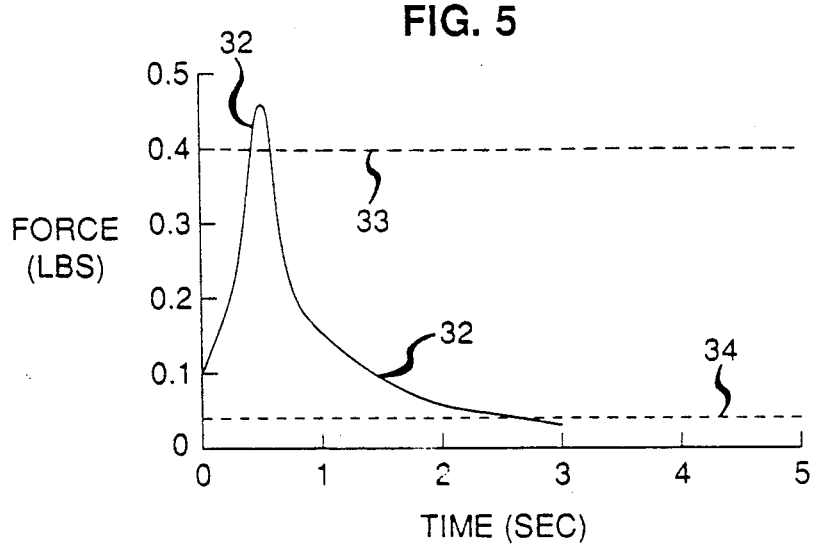
FIG. 5 is a graph of force on the pick-up tool of FIG. 1 as a function of time.

In operation, the pick-up tool 11 is directed by the robot so as to come in contact with a selected integrated chip. When the contact element 21 physically makes contact with chip 12, the force F on the load cell of FIG. 2 immediately generates an output. FIG. 5 is a graph of a curve 32 showing the force F in pounds on the load cell as a function of time; the signal transmitted by the load cell is proportional to such force. When the force exceeds a first threshold 33 such as, for example, 0.4 pounds, the computer 30 of FIG. 3 is programmed to stop vertical movement of the pick-up tool and simultaneously to actuate heater 20 of FIG. 1. At this point, contact element 21 is in contact with chip 12 and the heater heats the chip via contact element 21 so as to melt the solder bonds 13. This has the effect of reducing the stress on pick-up tool 11, as manifested by the descending portion of curve 32 of FIG. 5. When curve 32 crosses a second threshold 34, which may for example be 0.03 pounds, it generates a second signal. The computer 30 of FIG. 3 responds to the second signal so as to actuate vacuum pick up, that is, to cause a vacuum to be formed in vacuum channel 22 of FIG. 1, which causes the integrated circuit chip 12 to adhere to the pick-up tool. The second signal also causes the pick-up tool to move vertically upwardly so as to remove the chip 12 from the substrate. Thereafter, the robot operates in the conventional manner to desposit integrated circuit chip 12 in an appropriate receptacle, and then to reposition the pick-up tool for another cycle of operation.

Figure 4:
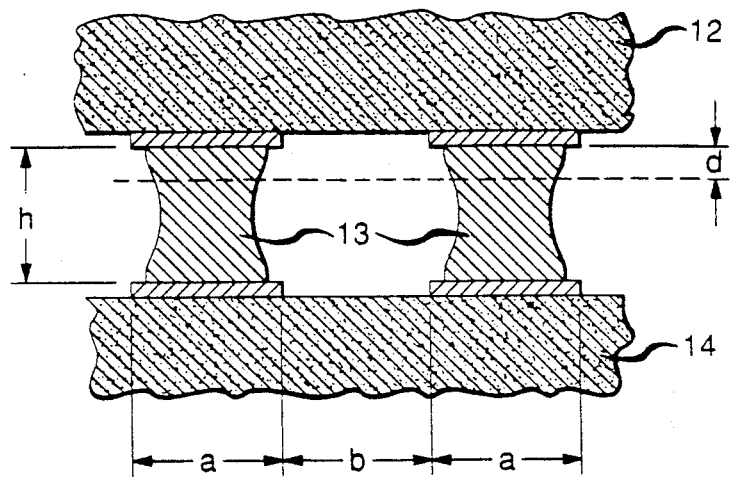
FIG. 4 is an enlarged view of part of FIG. 1, showing solder bonds interconnecting a portion of a chip with a portion of a substrate.

Referring to FIG. 4, there is shown an enlargement of part of the integrated circuit chip 12, the substrate 14 and solder bonds 13 of FIG. 1. In AVP modules with which the invention has been used, the dimension a of each side of the bonding pads is one hundred microns, and the separation b between successive bonding pads is one hundred microns. The height h of each of the solder bonds is approximately ninety microns. The integrated circuit chip may be eight millimeters on a side and there may be as many as eighty bonding pads on each side of the chip. With eighty bonding pads on each side of the chip, there may be as many as three hundred solder elements 13 between the integrated circuit chip and the substrate; these solder elements are used for interconnection as well as for structural bonding. One can appreciate that if the melting and lift off of the integrated circuit chip are not carefully controlled, one runs a high risk of molten solder unintentionally short circuiting adjacent bonding pads, which is known as "bridging."

The invention uses a strain gauge to detect a point at which there is melting to some suitable depth d of the solder bonds 13. Such melting of the solder to a suitable depth results in a decline of curve 32 of FIG. 5 so as to cross the threshold 34. Thus, one is able to actuate the pick-up tool and remove the chip before there has been complete melting of a major portion of the solder bonds 13. This greatly reduces the likelihood of bridging and leaves on the substrate 14 predictable quantities of remnant solder. The remnant solder can in turn be removed, for example, by the apparatus described in the U.S. Pat. No. 4,923,521 of Liu et. al., granted May 8, 1990, and hereby incorporated by reference herein. The Liu et al. patent describes a method for using a heated solder wick for removing solder remnants from substrate bonding pads by capillary action.

Certain AVP modules with which I have worked have as many as twenty-four integrated circuit chips on a single substrate. It can be appreciated that the electronics defined on such a module are quite complex and the chances are fairly high that it may be desired to remove a single chip from the completed module. The invention can be used to great advantage, particularly where there are a large number of solder bonds separated by an exceedingly small distance and it is imperative to avoid the bridging problem. The invention permits the removal without appreciably heating adjacent integrated circuit chips or their solder bonds. The operation of the robot for controlling the vacuum pick-up tool is well understood in the art and therefore has not been described in great detail, but, from the foregoing, one skilled in the art may appreciate the ease with which the invention can be applied to known robotic tools. The fabrication of a load cell using strain gauges in a resistance bridge connection so as to generate electrical signals in response to an applied mechanical load is also well understood in the art and therefore has not been described in great detail.

It is to be understood that various embodiments and modifications other than those explicity described may be used by those skilled in the art without departing from the spirit and scope of the invention. "Load cell" as used herein is intended to mean any device or aggregate of devices such as piezoelectric devices and strain gauges that generate an electrical signal in response to an applied force.

I claim:

1. A method for removing an element that has been soldered to the surface of a substrate comprising the steps of:

attaching a load cell to a vacuum pick-up tool, the load cell generating an electrical signal indicative of the mechanical stress of the tool against an object;

causing the pick-up tool to contact and to bear against the soldered element until the load cell generates a first signal indicative of a first level of stress;

in response to the first signal, heating the tool to a temperature sufficient to melt the solder bonding the element to the substrate, said melting resulting in a second level of stress on the tool which is smaller than the first level of stress, and further resulting in the load cell generating a second signal indicative of the second level of sress;

in response to the second signal, actuating the pick-up tool;

and using the pick-up tool to move the element from the substrate.

2. The method of claim 1 wherein:
the element in an integrated circuit chip.

3. The method of claim 1 wherein:
the pick-up tool is a vacuum pick-up tool;
and a vacuum is applied to the pick-up tool in response to the second signal so as to cause adhesion of the element to the pick-up tool.

4. The method of claim 3 wherein:
automatic control circuits are used for heating the tool in response to the first signal and for applying a vacuum in response to the second signal.

5. The method of claim 4 wherein:
the first signal stops movement of the pick-up tool;
and the second signal initiates movement of the pick-up tool.

6. The method of claim 1 wherein:
the load cell comprises at least one strain gauge.

7. The method of claim 6 wherein:
the load cell comprises a pair of strain gauges connected as arms of a resistance bridge.

8. Apparatus for removing an element that has been soldered to the surface of a substrate comprising:
a pick-up tool;
means comprising a load cell connected to the pick-up tool for generating an electrical signal indicative of the mechanical stress of the tool against an object;
means for causing the pick-up tool to contact and bear against the soldered element until the load cell generates a first signal indicative of a first level of stress;
means responsive to the first signal for heating the tool to a temperature sufficient to melt the solder bonding the element to the substrate, said melting resulting in a second level of stress on the pick-up tool that is smaller than the first level of stress;
means comprising the load cell for generating a second signal indicative of the second level of stress;
and means responsive to the second signal for actuating the pick-up tool and for causing the pick-up tool to remove the element from the substrate.

9. The apparatus of claim 8 wherein:
the element is an integrated circuit chip.

10. The apparatus of claim 8 wherein:
the pick-up tool is a vacuum pick-up tool; and further comprising;
means responsive to the second signal for applying a vacuum to the pick-up tool, thereby causing adhesion of the element to the pick-up tool.

11. The apparatus of claim 1 further comprising:
automatic control circuits for heating the tool in response to the first signal and for applying a vacuum in response to the second signal.

12. The apparatus of claim 11 further comprising:
means responsive to the first signal for stopping movement of the pick-up tool;
and means responsive to the second signal for initiating movement of the pick-up tool.

13. The apparatus of claim 8 wherein:
the load cell comprises a strain gauge.

14. The apparatus of claim 13 wherein:
the load cell comprises first and second strain gauges connected as arms in a resistance bridge.

* * * * *